United States Patent
Huang et al.

(10) Patent No.: US 10,068,774 B2
(45) Date of Patent: Sep. 4, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yi-Min Huang, Tainan (TW); Hsiu-Ting Chen, Tainan (TW); Shih-Chieh Chang, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/829,563

(22) Filed: Dec. 1, 2017

(65) Prior Publication Data
US 2018/0090330 A1  Mar. 29, 2018

Related U.S. Application Data

(63) Continuation of application No. 15/221,794, filed on Jul. 28, 2016, now Pat. No. 9,870,926.

(51) Int. Cl.
| | |
|---|---|
| *H01L 21/44* | (2006.01) |
| *H01L 21/48* | (2006.01) |
| *H01L 21/50* | (2006.01) |
| *H01L 31/0328* | (2006.01) |
| *H01L 31/0336* | (2006.01) |

(Continued)

(52) U.S. Cl.
CPC .. *H01L 21/28518* (2013.01); *H01L 21/76805* (2013.01); *H01L 21/76895* (2013.01); *H01L 23/535* (2013.01); *H01L 29/0653* (2013.01); *H01L 29/0847* (2013.01); *H01L 29/161* (2013.01); *H01L 29/165* (2013.01);

(Continued)

(58) Field of Classification Search
CPC ......... H01L 21/28518; H01L 21/76805; H01L 23/535; H01L 29/7848
USPC ......................................... 438/222; 257/190
See application file for complete search history.

(56) References Cited

U.S. PATENT DOCUMENTS

| | | | |
|---|---|---|---|
| 7,667,271 | B2 | 2/2010 | Yu et al. |
| 8,362,575 | B2 | 1/2013 | Kwok et al. |

(Continued)

FOREIGN PATENT DOCUMENTS

| | | |
|---|---|---|
| TW | 201608640 A | 3/2016 |
| TW | 201626560 A | 7/2016 |

OTHER PUBLICATIONS

Office Action issued in U.S. Appl. No. 15/221,794, dated May 11, 2017.

(Continued)

*Primary Examiner* — David S Blum
(74) *Attorney, Agent, or Firm* — McDermott Will & Emery LLP

(57) ABSTRACT

A method of manufacturing a source structure for a p-type metal-oxide-semiconductor (PMOS) field effect transistor (FET) is provided. In the method, a first epitaxial layer comprising $Si_{1-x}Ge_x$ is formed on a source region of an FET, a second epitaxial layer comprising $Si_{1-y}Ge_y$ is formed on the first epitaxial layer, a third epitaxial layer comprising $Si_{1-z}Ge_z$ is formed on the second epitaxial layer. Z is smaller than y.

20 Claims, 8 Drawing Sheets

(51) Int. Cl.
  *H01L 31/072* (2012.01)
  *H01L 31/109* (2006.01)
  *H01L 21/285* (2006.01)
  *H01L 23/535* (2006.01)
  *H01L 21/768* (2006.01)
  *H01L 29/66* (2006.01)
  *H01L 29/78* (2006.01)
  *H01L 29/06* (2006.01)
  *H01L 29/08* (2006.01)
  *H01L 29/165* (2006.01)
  *H01L 29/161* (2006.01)

(52) U.S. Cl.
  CPC .... *H01L 29/66795* (2013.01); *H01L 29/7848* (2013.01); *H01L 29/7851* (2013.01)

(56) References Cited

U.S. PATENT DOCUMENTS

| | | | |
|---|---|---|---|
| 8,367,498 | B2 | 2/2013 | Chang et al. |
| 8,440,517 | B2 | 5/2013 | Lin et al. |
| 8,497,528 | B2 | 7/2013 | Lee et al. |
| 8,610,240 | B2 | 12/2013 | Lee et al. |
| 8,680,576 | B2 | 3/2014 | Ching et al. |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,785,285 | B2 | 7/2014 | Tsai et al. |
| 8,796,759 | B2 | 8/2014 | Perng et al. |
| 8,809,139 | B2 | 8/2014 | Huang et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 2011/0068407 | A1 | 3/2011 | Yeh et al. |
| 2013/0011983 | A1 | 1/2013 | Tsai et al. |
| 2014/0252412 | A1 | 9/2014 | Tsai et al. |
| 2016/0064483 | A1 | 3/2016 | Kelly et al. |
| 2016/0111537 | A1 | 4/2016 | Tsai et al. |

OTHER PUBLICATIONS

Notice of Allowance issued in U.S. Appl. No. 15/221,794, dated Aug. 31, 2017.

SEMICONDUCTOR DEVICE AND MANUFACTURING METHOD THEREOF

RELATED APPLICATION

This application is a Continuation Application of U.S. Ser. No. 15/221,794, now U.S. Pat. No. 9,870,926, filed Jul. 28, 2016, the entire contents of which applications are incorporated herein by reference.

TECHNICAL FIELD

The disclosure relates to semiconductor integrated circuits, and more particularly to epitaxial source/drain structures for P-type metal-oxide-semiconductor (PMOS) field effect transistors (FETs).

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method. In the present disclosure a source and a drain are interchangeably used, and the structures and/or configurations for a source are applied to a drain.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
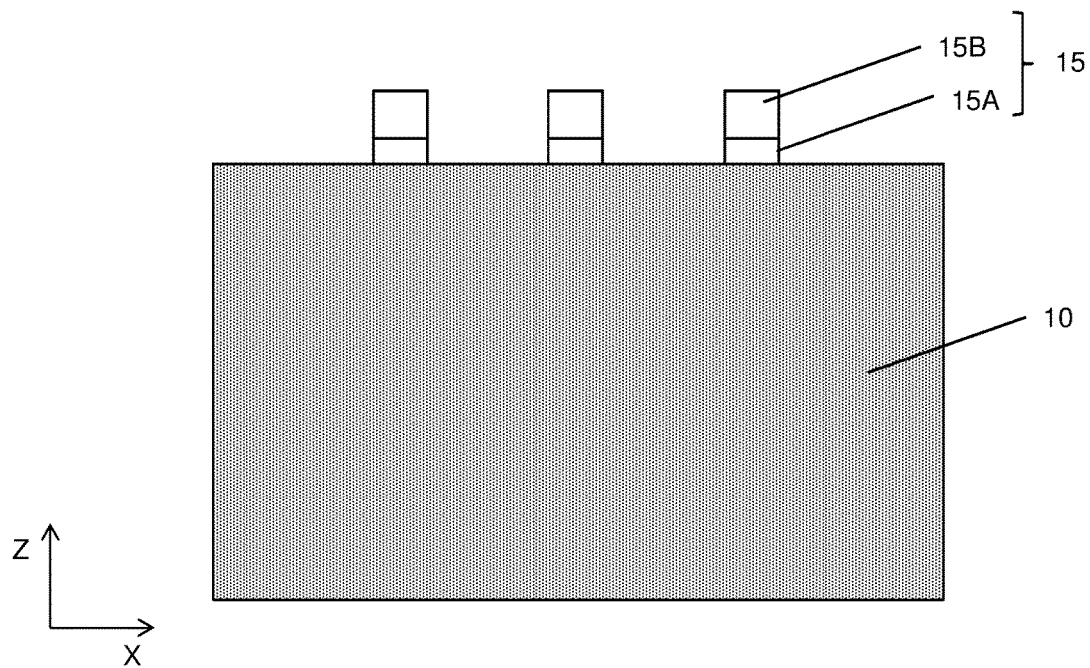
FIGS. 1-12 show exemplary cross sectional views of various stages for manufacturing a Fin FET device according to one embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

FIGS. 1-12 show exemplary cross sectional views of various stages for manufacturing a Fin FET device according to one embodiment of the present disclosure. It is understood that additional operations can be provided before, during, and after processes shown by FIGS. 1-12, and some of the operations described below can be replaced or eliminated, for additional embodiments of the method. The order of the operations/processes may be interchangeable.

To form a fin structure, a mask layer 15 is formed over a substrate 10. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 10 may comprise another elementary semiconductor, a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, CVD, plasma-enhanced chemical vapor deposition (PECVD), atmospheric pressure chemical vapor deposition (APCVD), low-pressure CVD (LP-CVD), high density plasma CVD (HDPCVD), atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 1.

Figure 2:
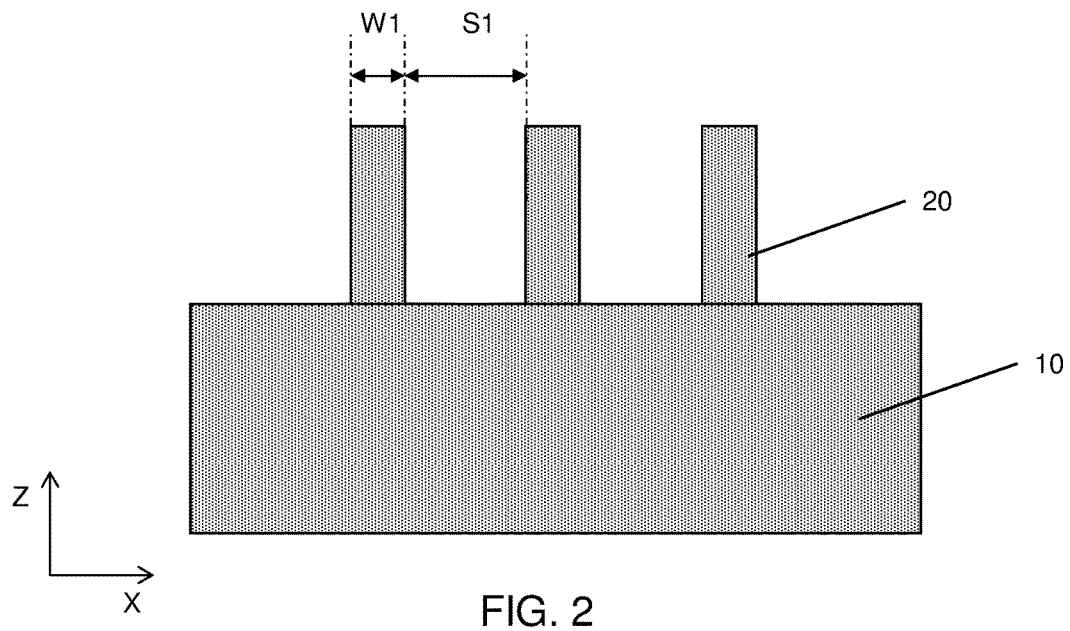

Then, as shown in FIG. 2, by using the hard mask pattern 15 as an etching mask, the substrate 10 is patterned into fin structures 20 by trench etching using a dry etching method and/or a wet etching method.

In FIG. 2, three fin structures 20 are disposed over the substrate 10. However, the number of the fin structures is not limited to three. The numbers may be as small as one, or more than three. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 15 nm in other embodiments. The space S1 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 30 nm to 60 nm, and is in a range from about 35 nm to about 55 nm in other embodiments.

Figure 3:
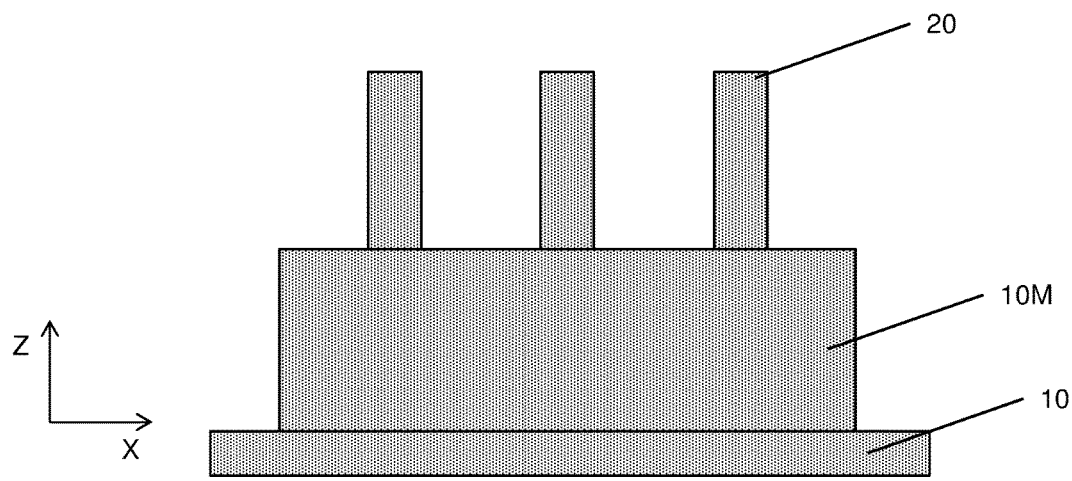

After the fin structures 20 are formed, the substrate 10 is further etched to form a mesa shape 10M, as shown in FIG. 3. In other embodiments, the mesa shape 10M is first formed, and then the fin structures 20 are formed.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 4:
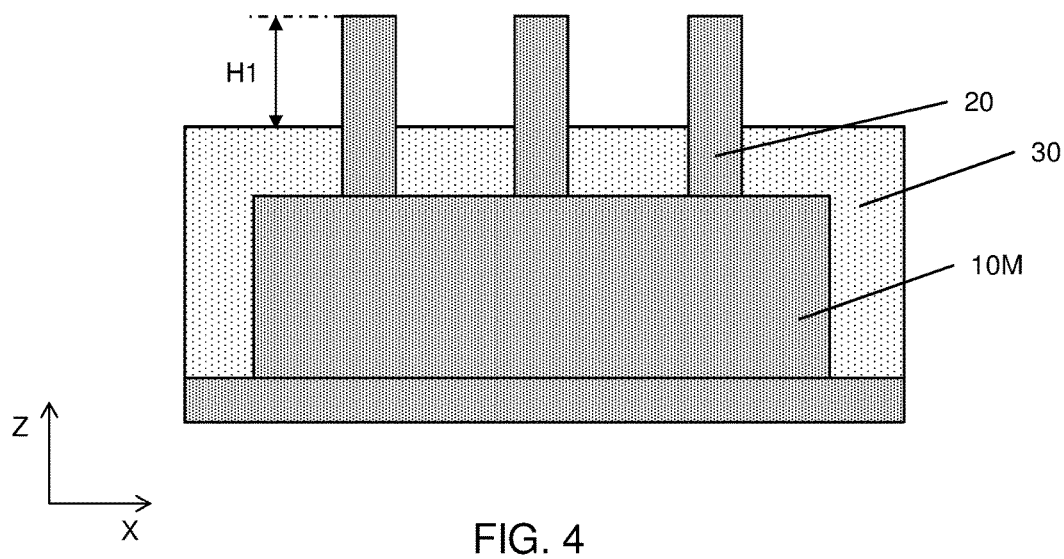

The insulating layer 30 is first formed in a thick layer so that the fin structures are embedded in the thick layer, and the thick layer is recessed so as to expose the upper portions of the fin structures 20, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 5A:
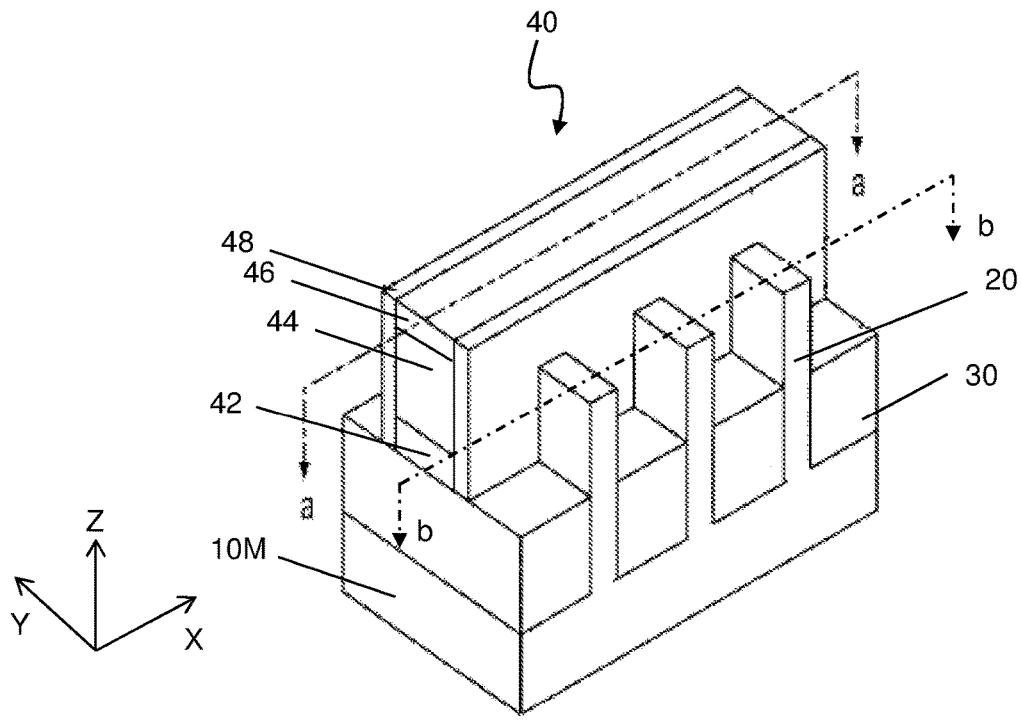
Figure 5B:
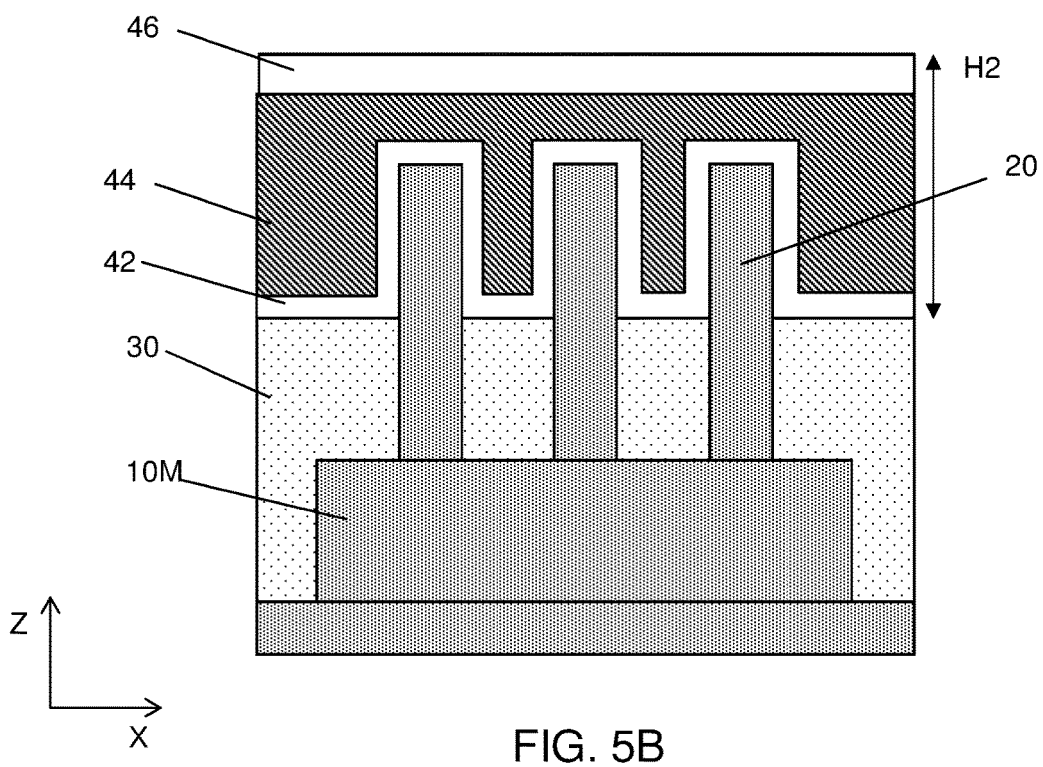
Figure 5C:
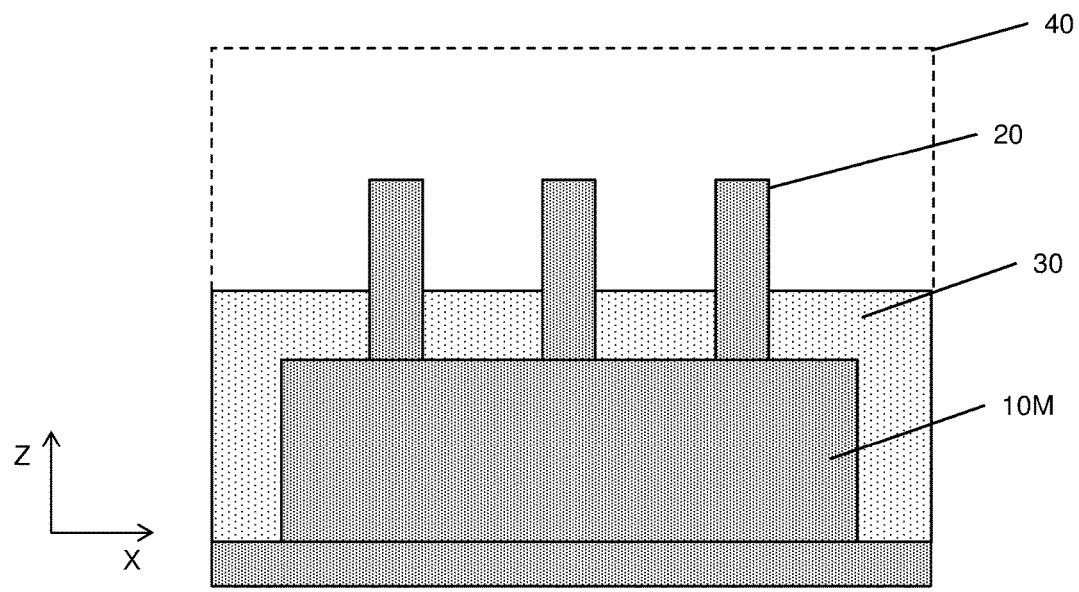

After the insulating layer 30 is formed, a gate structure 40 is formed over the fin structures 20, as shown in FIGS. 5A-5C. FIG. 5A is an exemplary perspective view, FIG. 5B is an exemplary cross sectional view along line a-a of FIG. 5A and FIG. 5C is an exemplary cross sectional view along line b-b of FIG. 5A. FIGS. 6-14 are also exemplary cross sectional views along line b-b of FIG. 5A.

As shown in FIG. 5A, the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 6:
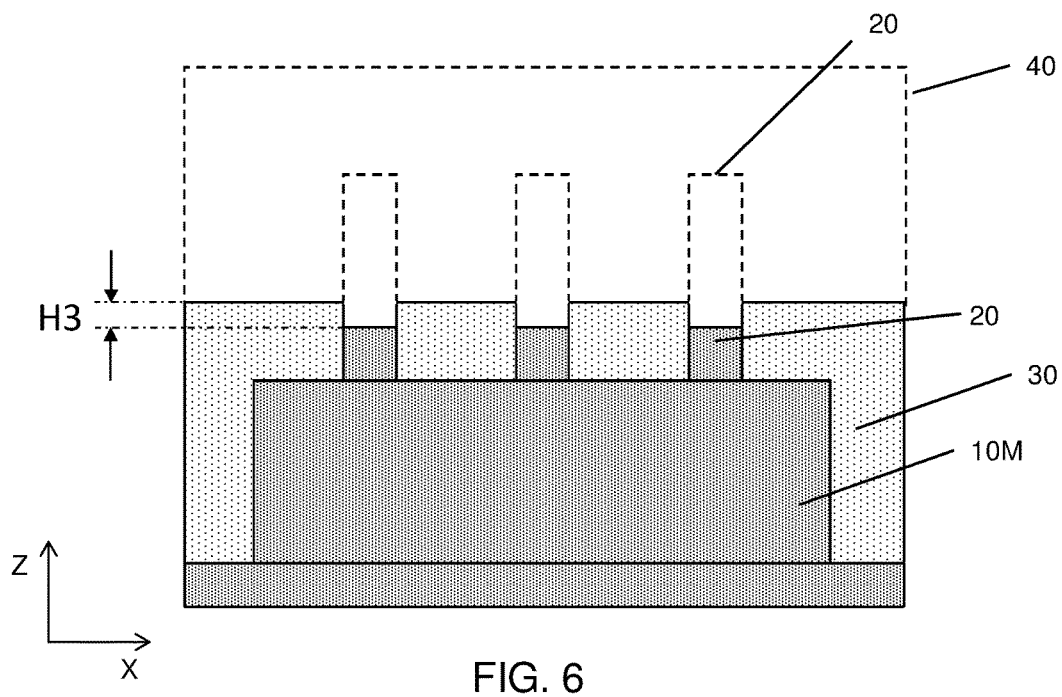

Then, as shown in FIG. 6, the upper portion of the fin structures 20 not covered by the gate structure 40 (i.e., source/drain regions) are recessed by a dry etching and/or a wet etching operation. The upper portion of the fin structures 20 are recessed (etched) down to the level equal to or below the upper surface of the isolation insulating layer 30, as shown in FIG. 6. The distance (depth) H3 between the upper surface of the isolation insulating layer 30 and the upper surface of the recessed fin structure 20 is up to about 50 nm in some embodiments.

Figure 7:
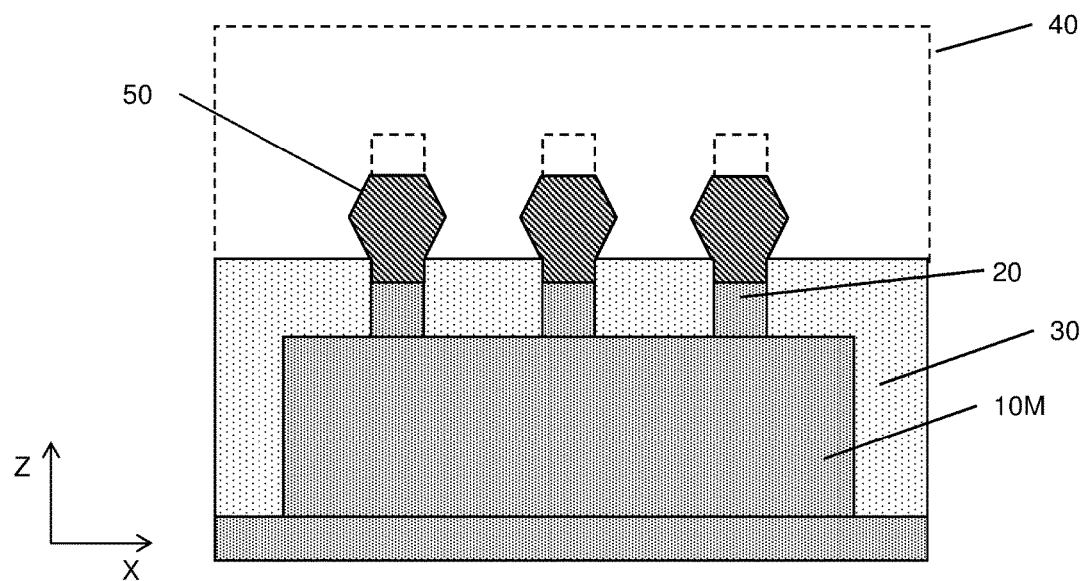
Figure 8:
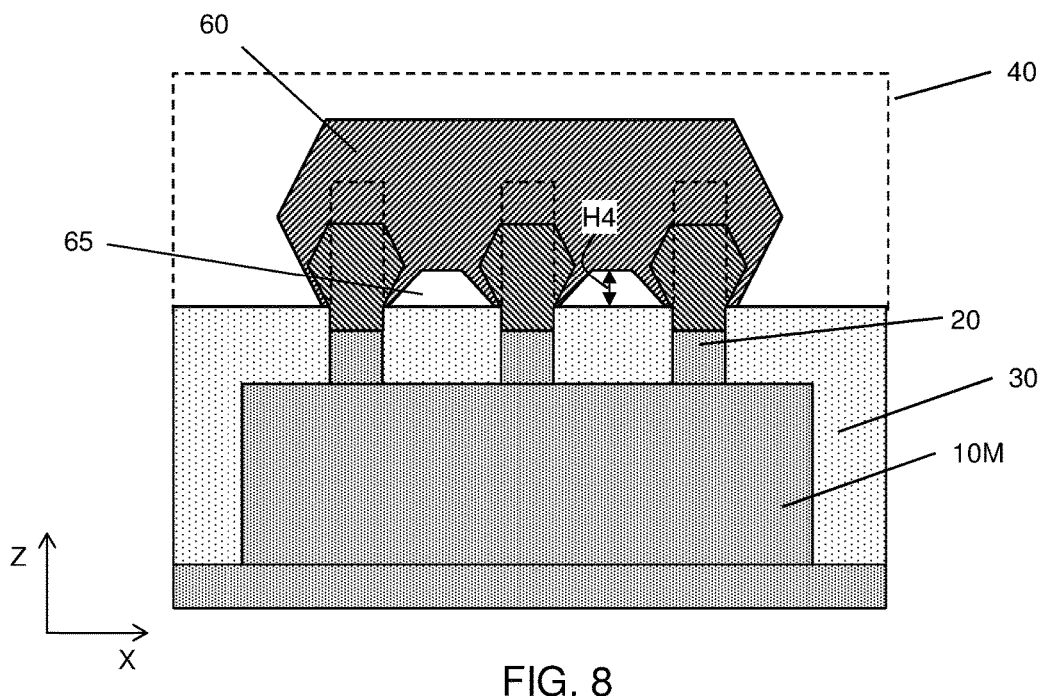
Figure 9:
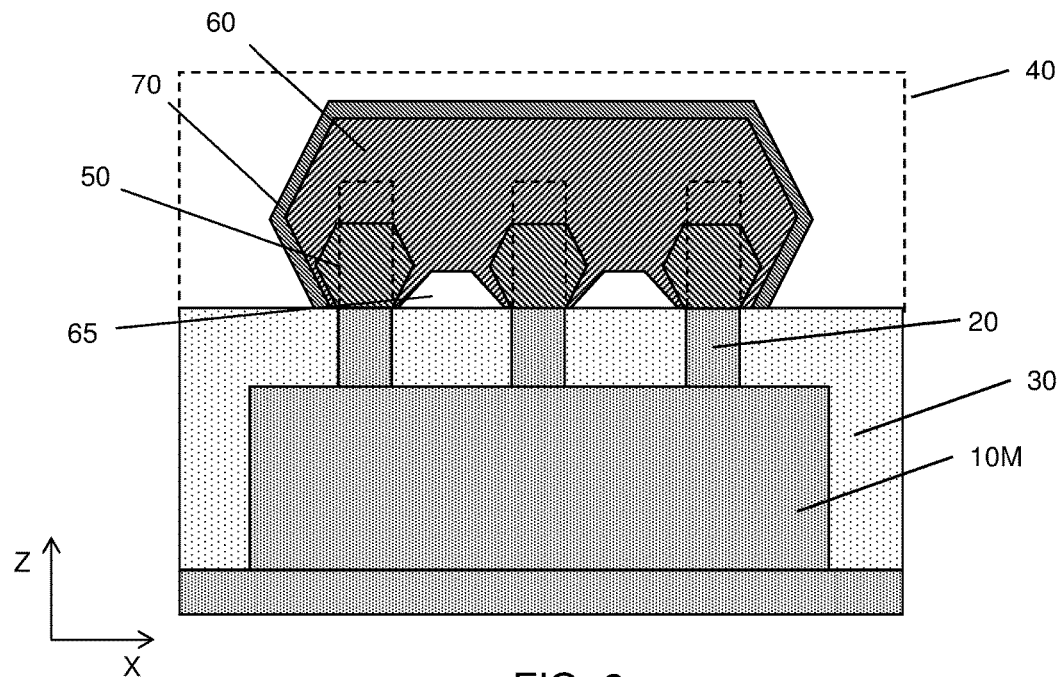

Then, as shown in FIGS. 7-9, an epitaxial source/drain structure is formed over the recessed fin structures 20. The epitaxial source/drain structure includes a first epitaxial layer 50, a second epitaxial layer 60 and a third epitaxial layer 70. The first epitaxial layer 50 includes $Si_{1-x}Ge_x$, the second epitaxial layer includes $Si_{1-y}Ge_y$, and the third epitaxial layer comprising $Si_{1-z}Ge_z$, wherein z is smaller than y. In some embodiments, x is smaller than y. In certain embodiments, z is smaller than x.

In some embodiments, the amount of Ge in the first epitaxial layer 50 satisfies $0.05<x\leq1.0$, the amount of Ge in the second epitaxial layer 60 satisfies $0.05<y\leq1.0$, and the amount of Ge in the third epitaxial layer satisfies $0.05\leq z\leq0.5$. The first epitaxial layer 50 may be a silicon layer. In other embodiments, the amount of Ge in the first epitaxial layer 50 satisfies $0.2\leq x\leq0.6$, the amount of Ge in the second epitaxial layer 60 satisfies $0.4\leq y\leq0.8$, and the amount of Ge in the third epitaxial layer satisfies $0.1\leq z\leq0.3$. A difference between z and y is in a range from about 0.05 to about 0.5 in some embodiments, and is in a range from about 0.1 to about 0.3 in other embodiments.

Each of the first to third epitaxial layers is doped with, for example, boron.

As shown in FIG. 7, the first epitaxial layer 50 is formed on the recessed fin structure 20. The thickness of the first epitaxial layer 50 measured from the upper surface of the recessed fin structure 20 is in a range from about 5 nm to about 50 nm in some embodiments. Depending on the depth H3, a part of the first epitaxial layer 50 is formed so as to protrude from the isolation insulating layer 30. Due to the crystal orientation of the substrate formed into the fin structures 20 (e.g., (100) plane), the first epitaxial layer 50 grows laterally and have a diamond-like shape.

After the first epitaxial layer 50 is formed, the second epitaxial layer 60 is formed over the first epitaxial layer 50. The thickness of the first epitaxial layer 50 measured from the upper surface of the first epitaxial layer 50 is in a range from about 5 nm to about 50 nm in some embodiments. Depending on the space S1 between the fin structures, the second epitaxial layers 60 merge adjacent second epitaxial layers.

In some embodiments, when the second epitaxial layers 60 are merged with the adjacent second epitaxial layers, a void 65 is formed between the fin structures, as shown in FIG. 8. In some embodiments, the height H4 of the void 65 is in a range from about 5 nm to about 30 nm measured from the upper surface of the isolation insulating layer 30.

Although in FIG. 7, the first epitaxial layers 50 are separately formed for the respective recessed fin structures and are not merged, the first epitaxial layers 50 may be merged above the upper surface of the isolation insulating layer 30, thereby creating the void 65.

Further, as shown in FIG. 9, the third epitaxial layer 70 is formed over the second epitaxial layer 60. The thickness of the third epitaxial layer 70 measured from the upper surface of the second epitaxial layer 60 is in a range from about 1 nm to about 50 nm in some embodiments, and is in a range from about 5 nm to about 30 nm in other embodiments.

In certain embodiment, the thicknesses of the first and third epitaxial layers are smaller than the thickness of the second epitaxial layer 60.

The first to third epitaxial layers may be grown at a temperature of about 600 to 800° C. under a pressure of about 5 to 150 Torr, by using a Si containing gas such as $SiH_4$, $Si_2H_6$ or $SiCl_2H_2$, a Ge containing gas, such as $GeH_4$, $Ge_2H_6$ or $GeCl_2H_2$, and/or a dopant gas, such as $BF_2$ or $B_2H_6$. The source/drain structure for an n-channel FET and the source/drain structure for a p-channel FET may be formed separately, while one of them is covered by a protective layer, such as silicon nitride.

Figure 10:
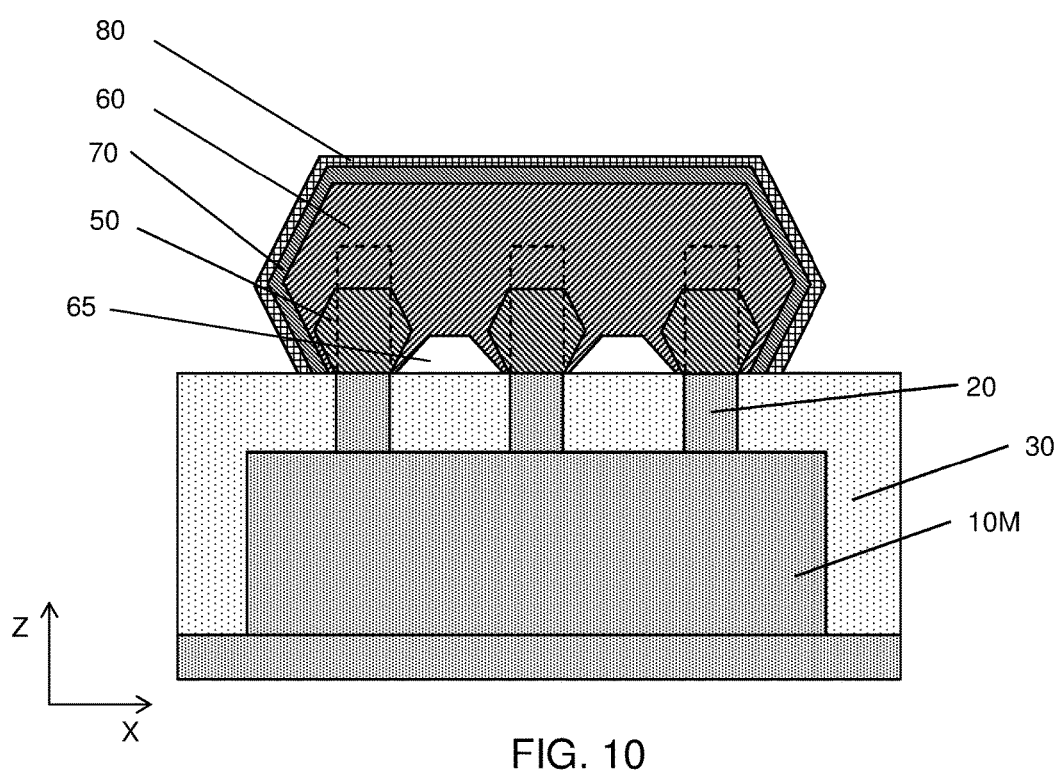

After the third epitaxial layer 70 is formed, a silicide layer 80 is formed over the third epitaxial layer 70, as shown in FIG. 10.

A metal material, such as Ti, Co, Ni, Ta and/or W, is formed over the third epitaxial layer 70, and an annealing operation is performed to form a silicide layer 80. The annealing operation is performed at a temperature of about 250° C. to about 850° C. The metal material is formed by CVD, PVD including sputtering, or ALD. The thickness of the silicide layer 80 is in a range from about 4 nm to about 10 nm in some embodiments. Before or after the annealing operations, the metal material or the silicide material formed over the isolation insulating layer 30 or other undesired portions is selectively removed.

Since the third epitaxial layer 70 contains Ge, the silicide layer 80 is an alloy layer of Si, Ge and one or more of the metal materials (e.g., Ti, Co and Ni).

In certain embodiments, the entire third epitaxial layer 70 is consumed to form the silicide layer 80, and the silicide layer 80 is in direct contact with the second epitaxial layer 60.

In this embodiment, a gate replacement technology is employed to form a metal gate structure (not shown), where the gate structure 40 is a dummy gate structure. After forming the silicide layer 80, the dummy gate structures (dummy gate electrode 44 and dummy gate dielectric layer 42) are removed and replaced with a metal gate structures (a metal gate electrode and a gate dielectric layer).

In certain embodiments, a first interlayer dielectric layer is formed over the dummy gate structures and a planarization operation, such as a chemical mechanical polishing (CMP) process or an etch-back process, is performed to expose the upper surface of the dummy gate electrode 44. Then, the dummy gate electrode 44 and the dummy gate dielectric layer 42 are removed, by appropriate etching processes, respectively, to form a gate opening. Metal gate structures including a gate dielectric layer and metal gate electrode are formed in the gate openings.

The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

Figure 11:
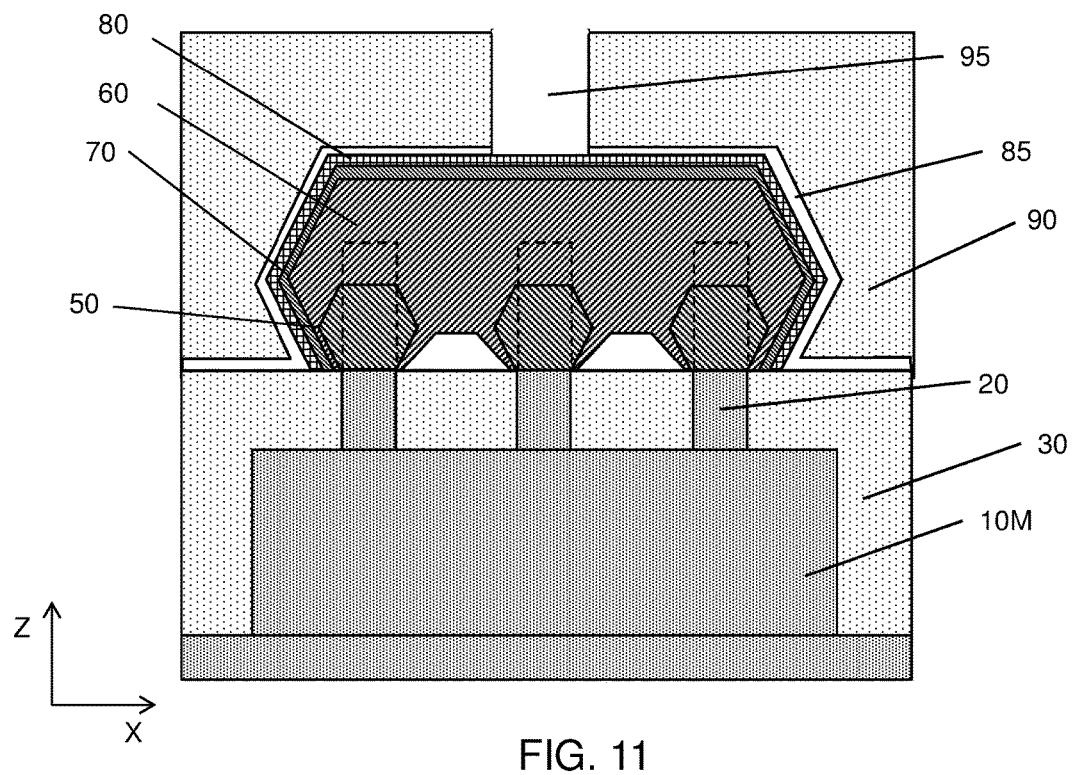

Then, as shown in FIG. 11, an insulating layer 85, functioning as a contact etching stop layer, is formed over the metal gate structure and the first to third epitaxial layer with the silicide layer 80, and then a second interlayer dielectric layer 90 is formed. The insulating layer 85 is one or more layers of insulating material. In one embodiment, the insulating layer 85 is made of silicon nitride formed by CVD.

By using a patterning operation including lithography, a contact hole 95 is formed in the second interlayer dielectric layer 90 and the insulating layer 85 so as to expose the silicide layer 80, as shown in FIG. 11.

Figure 12:
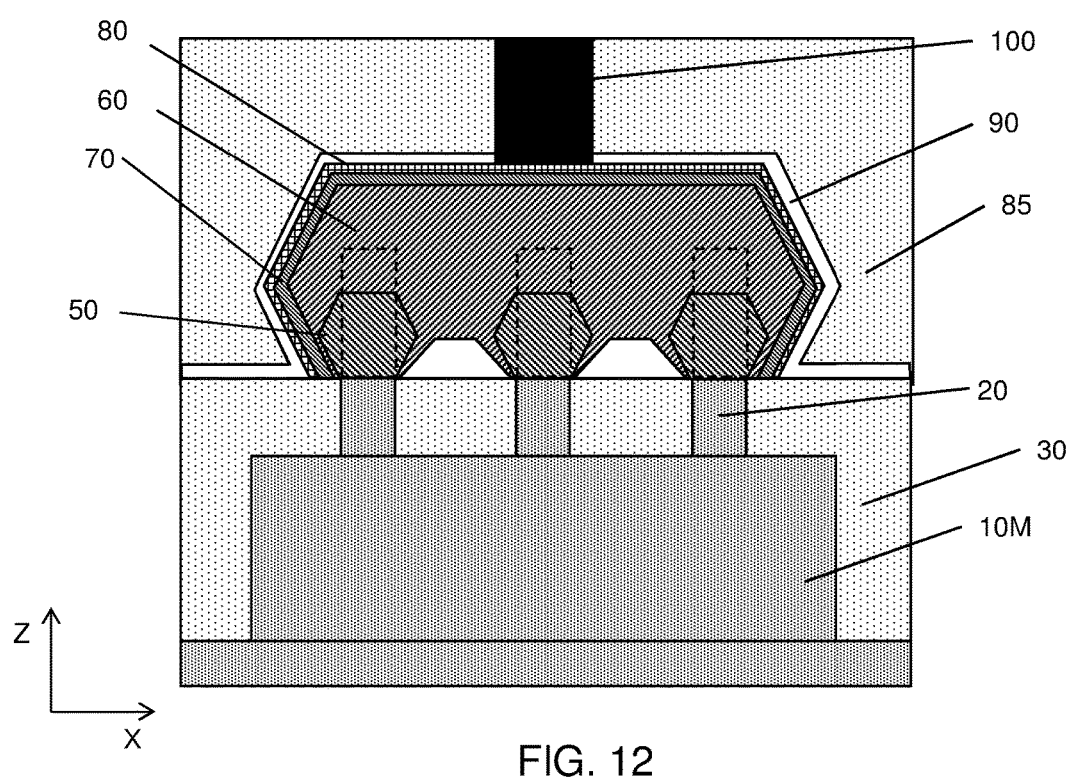

Then, the contact hole is filled with a conductive material, thereby forming a contact plug 100, as shown in FIG. 12. The contact plug 100 may include a single layer or multiple layers of any suitable metal such as Co, W, Ti, Ta, Cu, Al and/or Ni and/or nitride thereof.

After forming the contact plug, further CMOS processes are performed to form various features such as additional interlayer dielectric layers, contacts/vias, interconnect metal layers, and passivation layers, etc.

Figure 13:
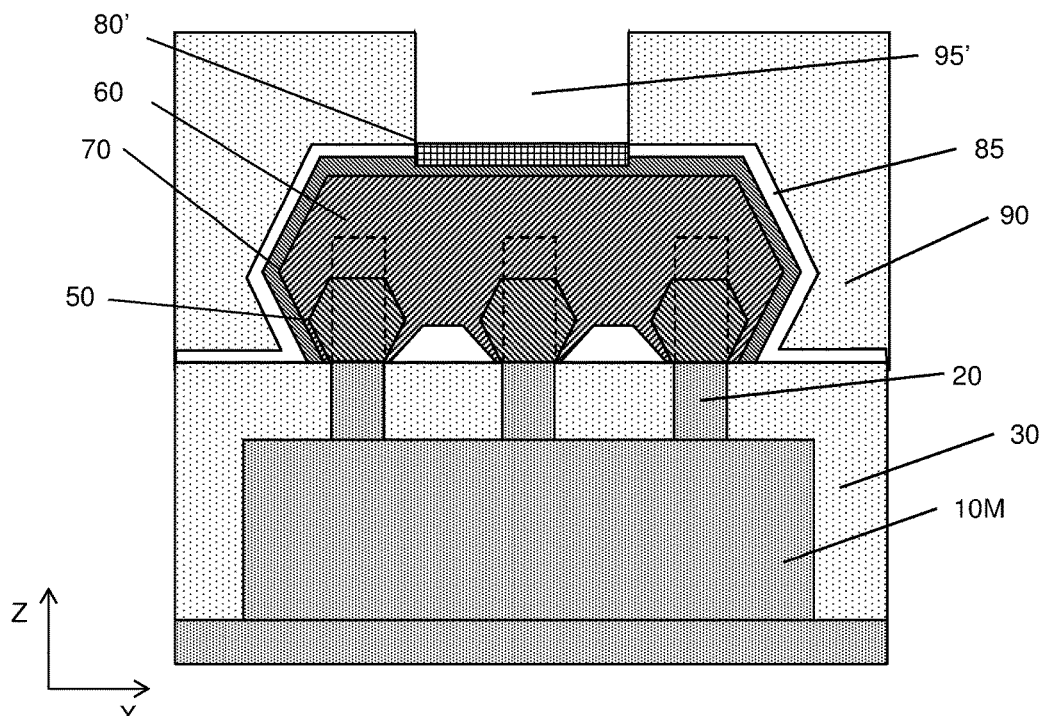
FIGS. 13 and 14 show exemplary cross sectional views of various stages for manufacturing a Fin FET device according to another embodiment of the present disclosure
Figure 14:
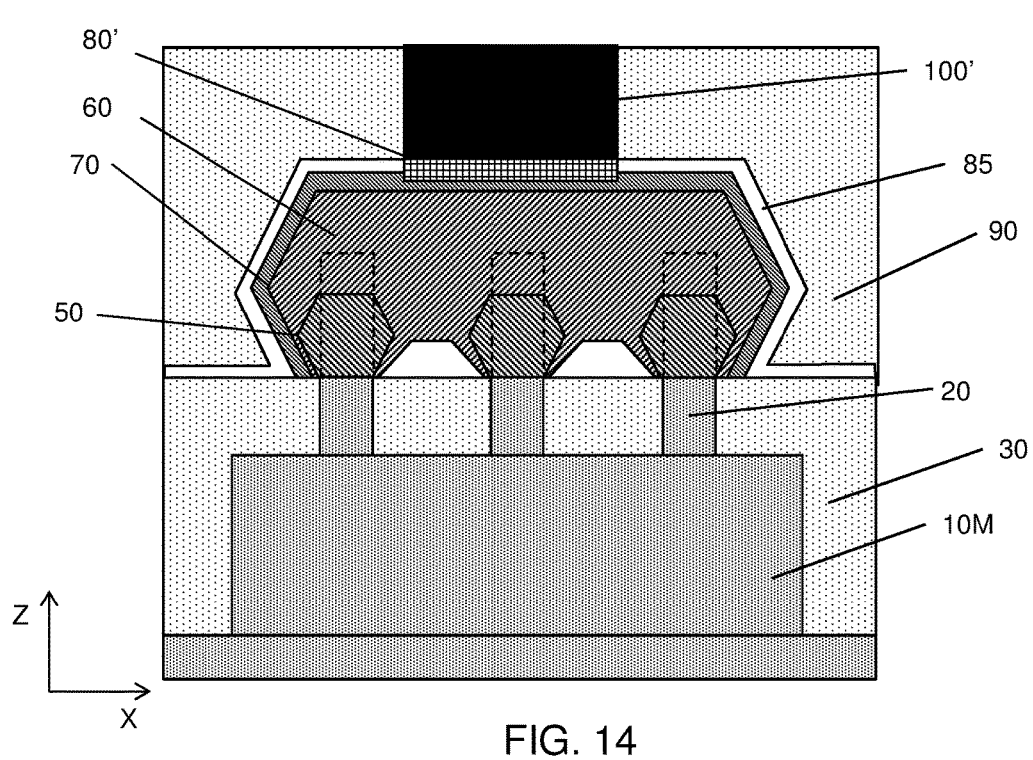

FIGS. 13 and 14 show exemplary cross sectional views of various stages for manufacturing a Fin FET device according to another embodiment of the present disclosure.

In the alternative, the silicide layer is formed after the contact hole is opened. In such a case, after forming the third epitaxial layer 70 as shown in FIG. 9, the metal gate structures, the insulating layer 85 (contact etching stop layer) and the interlayer dielectric layer 90 are formed, without forming a silicide layer. Then, a contact hole 95' is formed in the insulating layer 85 and the interlayer dielectric layer 90 to expose the upper surface of the third epitaxial layer 70, and then a silicide layer 80' is formed on the upper surface of the third epitaxial layer, as shown in FIG. 13. After forming the silicide layer, the conductive material is formed in the contact hole, thereby forming a contact plug 100', as shown in FIG. 14.

In the present disclosure, the source/drain structure of an FET includes multiple epitaxial layers (e.g., three), each of which is made of SiGe, and a Ge concentration of an uppermost layer (e.g., third epitaxial layer 70) of the multiple epitaxial layers is smaller than a Ge concentration of a second uppermost layer (e.g., second epitaxial layer 60) of the multiple epitaxial layers. With this configuration, when a silicide layer, in particular silicide of Ti, Ni or Co is formed on the uppermost layer, it is possible to reduce a contact resistance between the contact plug and the soured/drain structure. In some embodiments, the contact resistance can be reduced by about 1% to about 20%, compared with the case where a Ge concentration of an uppermost layer of the multiple epitaxial layers is equal to or larger than a Ge concentration of a second uppermost layer. Further, it is possible to suppress deposition of SiGe layer on undesired portions when the Ge concentration of the uppermost layer is smaller. It is noted that the number of epitaxial layers is not limited to three. The number of epitaxial layers can be two or four or more. However, in any case, a Ge concentration of an uppermost layer of the multiple epitaxial layers is smaller than a Ge concentration of a second uppermost layer.

Further, although in the above embodiments, a structure and a manufacturing operation of a FinFET are explained, the same source/drain structures can be employed in a planar type FET.

It will be understood that not all advantages have been necessarily discussed herein, no particular advantage is required for all embodiments or examples, and other embodiments or examples may offer different advantages.

In accordance with one aspect of the present disclosure, in a method of manufacturing a source/drain structure for a p-type metal-oxide-semiconductor (PMOS) field effect transistor (FET), a first epitaxial layer comprising $Si_{1-x}Ge_x$ is formed on a source/drain region of an FET, a second epitaxial layer comprising $Si_{1-y}Ge_y$ is formed on the first epitaxial layer, a third epitaxial layer comprising $Si_{1-z}Ge_z$ is formed on the second epitaxial layer. Z is smaller than y.

In accordance with another aspect of the present disclosure, in a method of manufacturing a p-type metal-oxide-semiconductor (PMOS) fin field effect transistor (FinFET), a fin structure is formed over a substrate. The fin structure extends in a first direction in plan view. An isolation insulating layer is formed over the substrate so that a lower portion of the fin structure is embedded in the isolation insulating layer and an upper portion of the fin structure is exposed from the isolation insulating layer. A gate structure is formed over a part of the fin structure. The gate structure extends in a second direction crossing the first direction in plan view. An upper portion of the fin structure not covered by the gate structure is recessed. A first epitaxial layer comprising $Si_{1-x}Ge_x$ is formed on the recessed fin structure, a second epitaxial layer comprising $Si_{1-y}Ge_y$ is formed on the first epitaxial layer, and a third epitaxial layer comprising $Si_{1-z}Ge_z$ is formed on the second epitaxial layer. A metal layer comprising at least one of Ti, Co and Ni is formed on the third epitaxial layer. An alloy layer of Si, Ge and the at least one of Ti, Co and Ni is formed by a reaction of the third epitaxial layer and the metal layer. X is smaller than y, and z is smaller than y.

In accordance with another aspect of the present disclosure, a semiconductor device includes an isolation insulating layer disposed over a substrate, a fin structure disposed over the substrate, a gate structure disposed over a part of the fin structure, a source/drain structure, and a source/drain contact. The fin structure extends in a first direction in plan view, and the gate structure extends in a second direction crossing the first direction. The source/drain structure includes multiple epitaxial layers, each of which is made of SiGe. A Ge concentration of an uppermost layer of the multiple epitaxial layers is smaller than a Ge concentration of a second uppermost layer of the multiple epitaxial layers. An alloy layer comprising Si, Ge and Ti is formed between the uppermost layer and the source/drain contact.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a source/drain structure for a p-type metal-oxide-semiconductor (PMOS) field effect transistor (FET), the method comprising:
    forming a first epitaxial layer on a source/drain region of an FET, the first epitaxial layer comprising $Si_{1-x}Ge_x$;
    forming a second epitaxial layer on the first epitaxial layer, the second epitaxial layer comprising $Si_{1-y}Ge_y$; and
    forming a third epitaxial layer on the second epitaxial layer, the third epitaxial layer comprising $Si_{1-z}Ge_z$,
    wherein z is smaller than y, and
    a thickness of the third epitaxial layer is equal to or greater than 1 nm and equal to or less than 50 nm.

2. The method of claim 1, wherein z is smaller than x.

3. The method of claim 2, wherein x is smaller than y.

4. The method of claim 1, wherein $0.05 \leq z \leq 0.5$.

5. The method of claim 1, wherein $0.05 < y \leq 1.0$.

6. The method of claim 1, wherein $0.05 < x \leq 1.0$.

7. The method of claim 1, wherein the source region is made of Si.

8. The method of claim 1, wherein a thickness of the third epitaxial layer is smaller than a thickness of the second epitaxial layer.

9. The method of claim 8, wherein the FET is a fin FET.

10. The method of claim 8, wherein each of the first to third epitaxial layers is doped with boron.

11. A p-type metal-oxide-semiconductor (PMOS) field effect transistor (FET), comprising:
    a gate; and
    a source/drain structure,
    wherein the source/drain structure includes:
        a first epitaxial layer comprising $Si_{1-x}Ge_x$;
        a second epitaxial layer disposed on the first epitaxial layer and comprising $Si_{1-y}Ge_y$; and
        a third epitaxial layer disposed on the second epitaxial layer and comprising $Si_{1-z}Ge_z$, and
    z is smaller than y, and x is smaller than y.

12. The PMOS FET of claim 11, wherein z is smaller than x.

13. The PMOS FET of claim 11, wherein $0.05 \leq z \leq 0.5$.

14. The PMOS FET of claim 11, wherein $0.05 < y \leq 1.0$.

15. The PMOS FET of claim 11, wherein $0.05 < x \leq 1.0$.

16. The PMOS FET of claim 11, wherein the first epitaxial layer is formed on a Si layer.

17. The PMOS FET of claim 11, wherein a thickness of the third epitaxial layer is smaller than a thickness of the second epitaxial layer.

18. The PMOS FET of claim 11, wherein a thickness of the third epitaxial layer is equal to or greater than 1 nm and equal to or less than 50 nm.

19. The PMOS FET of claim 11, wherein each of the first to third epitaxial layers is doped with boron.

20. A semiconductor device comprising:
    an isolation insulating layer disposed over a substrate;
    a fin structure disposed over the substrate, the fin structure extending in a first direction in plan view;
    a gate structure disposed over a part of the fin structure, the gate structure extending in a second direction crossing the first direction; and
    a source/drain structure;
    the source/drain structure includes:
        a first epitaxial layer comprising $Si_{1-x}Ge_x$;
        a second epitaxial layer disposed on the first epitaxial layer and comprising $Si_{1-y}Ge_y$; and
        a third epitaxial layer disposed on the second epitaxial layer and comprising $Si_{1-z}Ge_z$, and
    z is smaller than y, and x is smaller than y.

* * * * *